United States Patent [19]

O'Loughlin

[11] Patent Number: 5,444,308
[45] Date of Patent: Aug. 22, 1995

[54] NANOSECOND TRANSMISSION LINE CHARGING APPARATUS

[75] Inventor: James P. O'Loughlin, Albuquerque, N. Mex.

[73] Assignee: The United States of America as represented by the Secretary of the Air Force, Washington, D.C.

[21] Appl. No.: 72,621

[22] Filed: Jun. 4, 1993

[51] Int. Cl.⁶ .................................. H03K 3/00
[52] U.S. Cl. ........................ 307/106; 315/39; 174/124 R
[58] Field of Search .............. 315/55, 71, 111.01, 315/111.21, 111.31, 330; 313/567–570, 601–602; 307/105–106, 268, 263; 174/122 R, 124 R

[56] References Cited

U.S. PATENT DOCUMENTS

| | | | |
|---|---|---|---|
| 4,477,746 | 10/1984 | Piltch | 315/39 |
| 4,871,925 | 10/1989 | Yamauchi et al. | 307/106 |
| 4,912,369 | 3/1990 | Moran et al. | 315/58 |
| 4,918,325 | 4/1990 | Busby et al. | 307/106 |

Primary Examiner—Steven L. Stephan
Assistant Examiner—Aditya Krishnan
Attorney, Agent, or Firm—William G. Auton

[57] ABSTRACT

A device for charging PFLs (Pulse Forming Lines) on a time scale of a few nanoseconds. The device includes a source transmission line (STL) connected through a switch to a pulse forming transmission line. The source line is initially charged while the PFL is uncharged, and the switch is open. The impedance of the STL is larger than the impedance of the PFL. In operation when the switch is closed, energy flows from the source line to the PFL. As the energy and voltage build on the PFL, an output switch closes and delivers the energy of the PFL to the output transmission line section. The impedance of the output transmission line section is matched to the PFL impedance so that all of the energy in the PFL flows into the output section in the form of a pulse.

20 Claims, 5 Drawing Sheets

FIG. 3
| FIG. 3A |
| FIG. 3B |
| FIG. 3C |
FIG. 3A
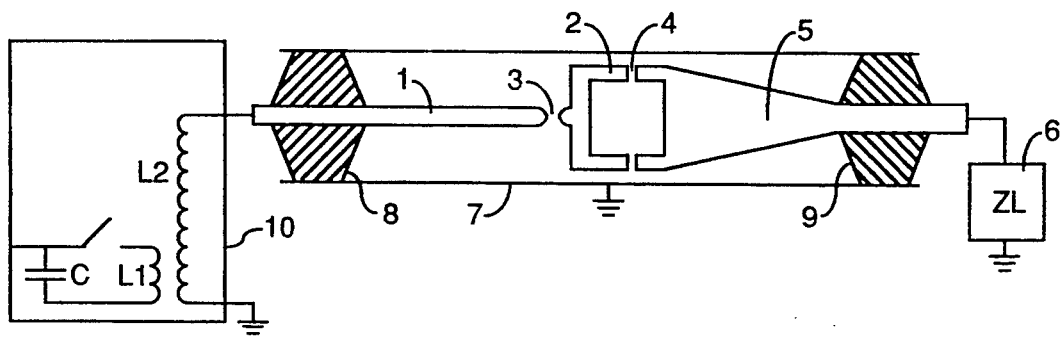
FIG. 3B
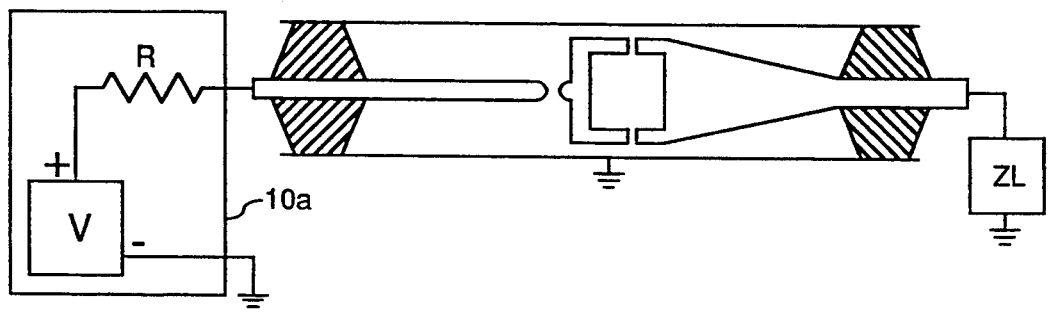
FIG. 3C
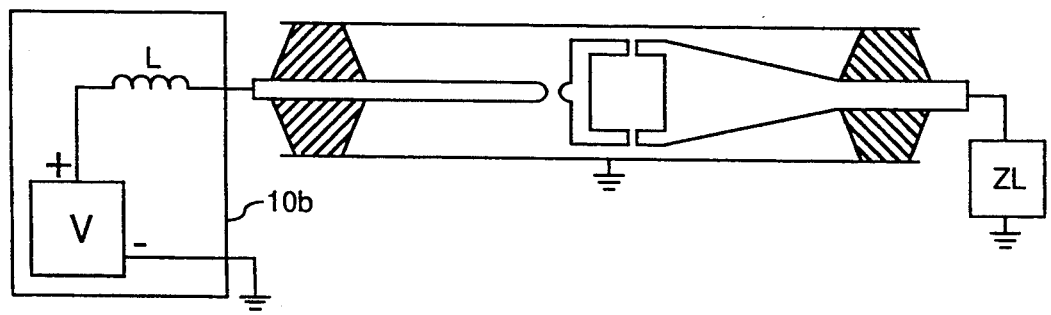

$Nz = Z0 / Z1 \qquad Nt = T0 / T1$

FIG. 6
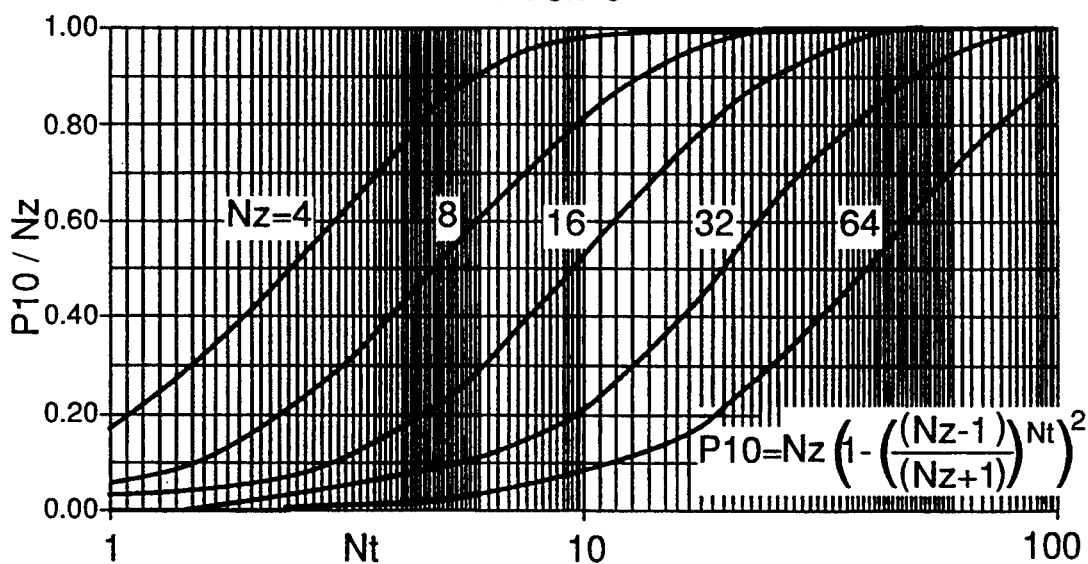
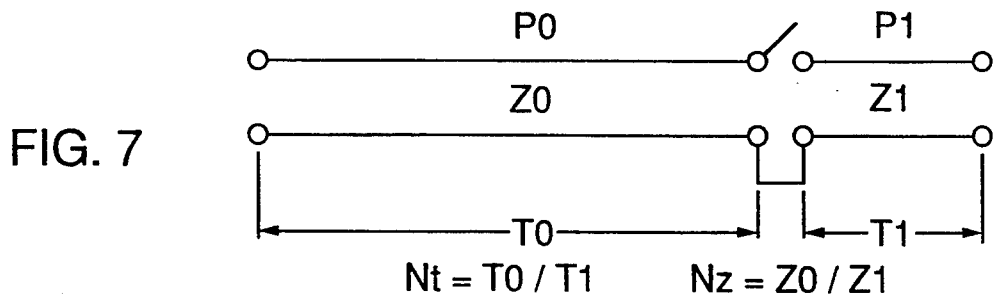
FIG. 7
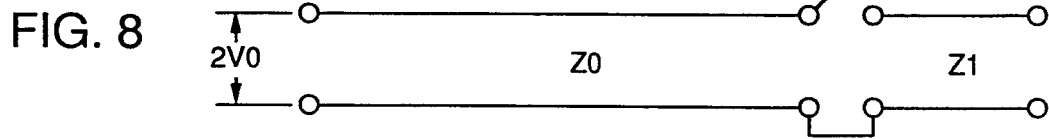
FIG. 8
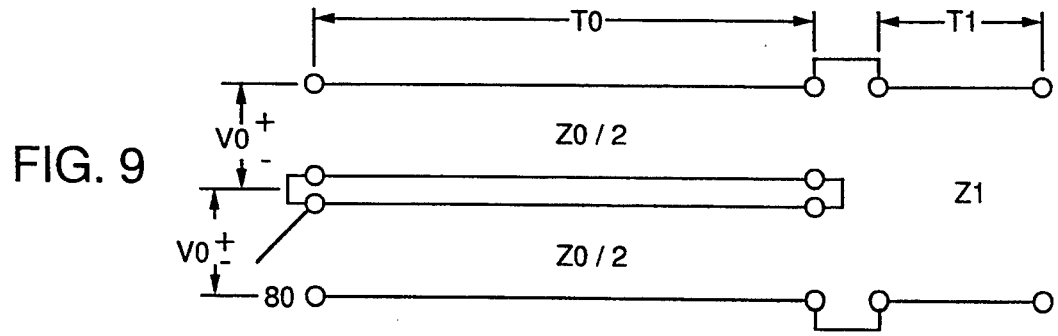
FIG. 9

NANOSECOND TRANSMISSION LINE CHARGING APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to pulse generation, and more specifically the invention pertains to a device for charging PFLs (Pulse Forming Lines) on a time scale of a few nanoseconds. Historically the most basic method for pulse generation is the discharge of a charged PFL into a load by a switch. The generation of very short pulses in the range of nanoseconds or picoseconds requires a very fast switch. High pressure gas switches which multichannel are capable of switching faster and can handle higher powers than any other type including solid state. Calculations show that switching speeds on the order of a few picoseconds are possible at several hundred kilovolts. The multichannel operation means that the switch closure consists of multichannels of conduction thus the lower switch impedance is due to the large number of parallel impedances per channel. In order to obtain multichannel operation it is necessary to "over volt" the switch, i.e. apply the voltage to the switch very rapidly. The conventional methods of applying voltage to the switch or charging the PFL is to use either a charging inductor or charging resistor. However, when the time of charging is on the order of nanoseconds charging inductors and resistors are impractical because the impedance of these components must be so low that insufficient isolation from the charging power source is provided.

The task of providing a method for rapidly charging the PFL or equivalently applying voltage to the switch is alleviated, to some extent, by the systems disclosed in the following U.S. Patents, the disclosures of which are incorporated herein by reference:

U.S. Pat. No. 4,918,325 issued to Busby et al.;
U.S. Pat. No. 4,912,369 issued to Moran et al.;
U.S. Pat. No. 4,871,925 issued to Yamauchi et al.; and
U.S. Pat. No. 4,477,746 issued to Piltch.

The patents identified above, relate to pulse generating devices. In particular, the Busby et al. patent describes a fast rise time pulse power system. A pulse generator is electrically connected to an electrical load using a coaxial transmission line with inner and outer conductors, a polyvinyl chloride (PVC) dielectric flashover switch, a metal ring, and velvet electrical insulation between the inner and outer conductions of the transmission line. The outer conductor is directly connected between the pulse generator and the load. The inner conductor has two sections with the PVC switch fixed such that it electrically connects the two sections. The first section of the velvet covered inner conductor electrically connects the pulse generator to the PVC switch, while the second section electrically connects the PVC switch to the load. The metallic ring circumscribes the outer conductor of the transmission line near the end that is connected with the load. Such a system provides a current and voltage rise/time of subnanosecond time periods. The Moran et al. patent is directed to a triggerable, high voltage, high current, spark gap switch for use in pulse power systems. The device is triggered by introducing an arc between one electrode and a trigger pin. High repetition rates are obtained by operating the trigger at voltages below the self-breakdown voltage of the device.

The Yamauchi et al. patent relates to a high voltage pulse generating apparatus. The apparatus comprises at least one magnetic switch with a magnetic core. The core contains a soft magnetic alloy ribbon wound in a toroidal form. The alloy contains such elements as iron, copper, niobium, tantalum, molybdinum and titanium, with at least fifty percent of the alloy structure being fine crystalline particles.

The Piltch patent describes a high repetition rate switch for delivering short duration, high power electrical pulses from a power supply such that the power supply produces an electric field between the electrodes near breakdown potential. The microwave generator is connected to the microwave waveguide and produces pulses having sufficient energy to distort the electric field to cause breakdown between the rail electrodes. The rail electrodes provide a large conduction area that reduces induction effects of the switch and minimizes electrode erosion. Although these patents relate to pulse generating devices, they do not describe a device utilizing impedance matching techniques to facilitate energy flow.

SUMMARY OF THE INVENTION

The present invention includes a device for charging PFLs (Pulse Forming Lines) on a time scale of a few nanoseconds. The device comprises a source transmission line (STL) connected through a switch to a pulse forming transmission line. The source line is initially charged while the PFL is uncharged, and the switch is open. The impedance of the STL is larger than the impedance of the PFL. In operation when the switch is closed, energy flows from the source line to the PFL. As the energy and voltage build on the PFL, an output switch closes and delivers the energy of the PFL to the output transmission line section. The impedance of the output transmission line section is matched to the PFL impedance so that all of the energy in the PFL flows into the output section in the form of a pulse.

It is an object of the invention to provide a means for charging PFLs (Pulse Forming Lines) on a time scale of a few nanoseconds. The need for the invention is basic to the method of generating subnanosecond pulses using very high pressure gas switches. This method requires a very fast low inductance switch such as is possible with gas pressures of up to 350 atmospheres or more. The proper operation of this type of switch requires that the voltage be applied to the switch in only a few nanoseconds. The invention is an efficient and advantageous means of accomplishing this.

These objectives together with other objectives, features and advantages of the invention will become more readily apparent from the following detailed description when taken in conjunction with the accompanying drawing wherein like elements are given like reference numerals throughout.

DESCRIPTION OF THE DRAWINGS

FIG. 3 is an illustration of the present invention;

FIG. 6 is a chart of the normalized power transfer ratio, line 0 to line 1 vs Nt for Nz-4, 8, 16, 32, 64;

FIG. 7 is an illustration of two PFL switch configurations to illustrate Nt=T0/T1 and Nz=Z0/Z1;

FIG. 8 is an illustration of a single source line;

FIG. 9 is an illustration of a Blumelein source line that is equivalent to that of FIG. 8.

DETAILED DESCRIPTION OF THE PREFERRED EMBODIMENT

Figure 1:
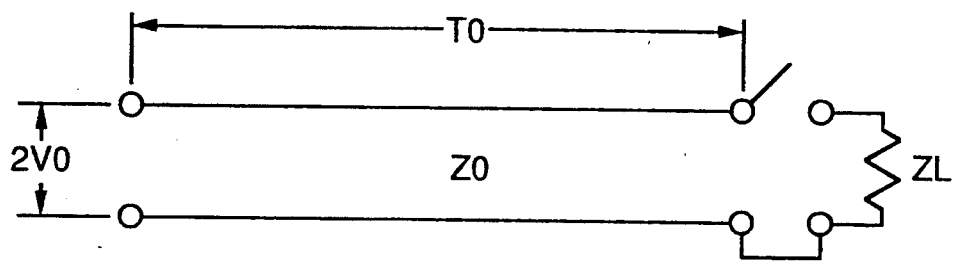
FIG. 1 is an illustration of a prior art pulse forming system.

The present invention is a device for charging PFLs on a time scale of a few nanoseconds. As mentioned above the most basic method for pulse generation is the discharge of a charged PFL into a load by a switch. The diagram of this method is shown in FIG. 1. The PFL is charged to a voltage, VO. The source from which the PFL is charged must be isolated by some means from the PFL. The isolation can be an isolation switch or an isolation impedance. The isolation impedance may be an inductor, a resistor or some other means of providing a high impedance isolation. The pulse which the PFL generates will have a basic time duration which is twice the electrical length of the PFL, i.e. 2*T0, where T0 is the one way transit time of the PFL. The shape of the pulse is determined by the impedance of the switch and the relation of the characteristic impedance of the PFL, Z0, to the load impedance ZL. The switch must have a switching speed which is fast compared to the desired rise time of the output pulse. It must also have an "on" impedance which is small compared to the PFL impedance if the method is to be efficient. The ratio of Z0 to ZL determines the characteristic of the output depending on the value of Z0/ZL.

The voltage transmission coefficient from the PFL to the load is:

$$VT01 = 2\frac{ZL}{(Z0 + ZL)} = \frac{2}{1 + \frac{Z0}{ZL}} \quad (1)$$

The voltage reflection coefficient from the load to the PFL is:

$$VR10 = \frac{(ZL - Z0)}{(ZL + Z0)} = \frac{1 - \frac{Z0}{ZL}}{1 + \frac{Z0}{ZL}} \quad (2)$$

Figure 2:
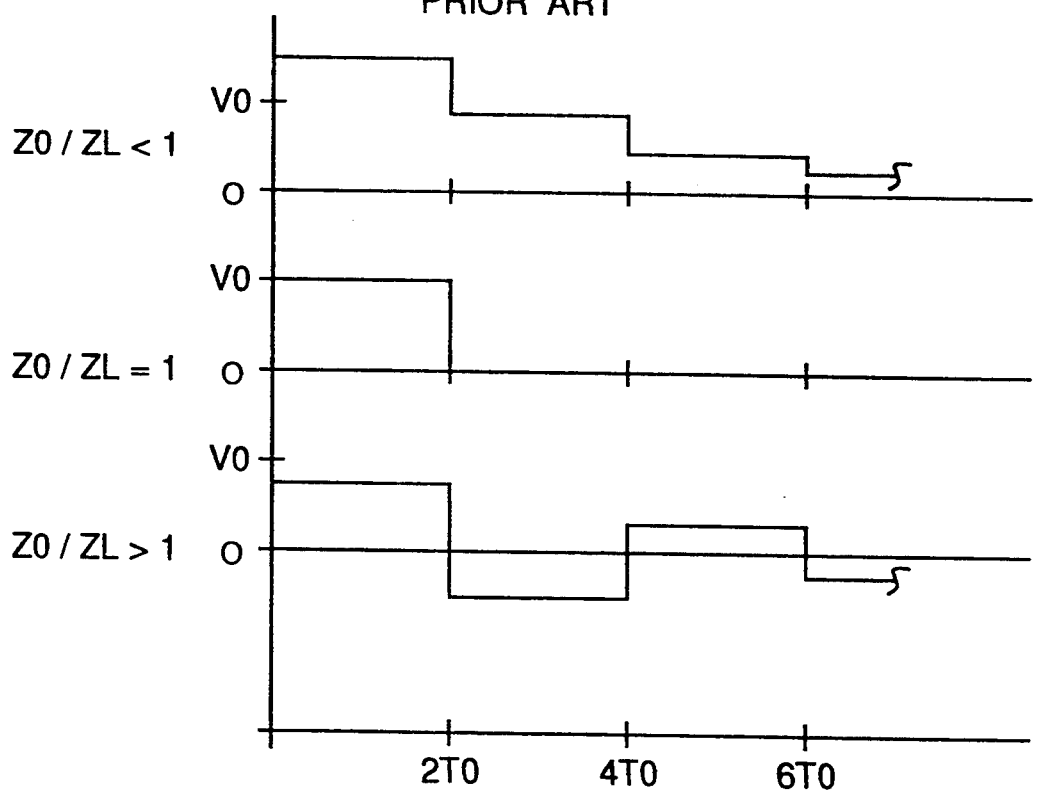
FIG. 2 is a chart of the characteristics of the pulse forming line of FIG. 1.

The resulting load pulse characteristics depending upon the value of Z0/ZL being less than 1, equal to 1 or greater than 1 are shown in FIG. 2 where:

T0=Delay tine length (one way)
Z0=Characteristic impedance
VT01=Voltage transmission coef.
VR10 =Voltage reflection coef.

Usually the design objective is to keep the value of Z0/ZL as close to 1 as possible. This results in the maximum transfer of energy and the best shaped pulse.

The generation of very short pulses in the range of nanoseconds or picoseconds requires a very fast switch. High pressure gas switches which multichannel are capable of switching faster and can handle higher powers than any other type including solid state. Calculations show that switching speeds on the order of a few picoseconds are possible at several hundred kilovolts. The multichannel operation means that the switch closure consists of multichannels of conduction as opposed to a single filament. The advantage of the multichannel conduction is the lower impedance due to the large number of parallel impedances per channel. In order to obtain multichannel operation it is necessary to "over volt" the switch, i.e. apply the voltage to the switch very rapidly. The conventional methods of applying voltage to the switch or charging the PFL is to use either a charging inductor or charging resistor. However, when the time of charging is on the order of nanoseconds charging inductors and resistors are impractical because the impedance of these components must be so low that insufficient isolation from the charging power source is provided.

Thus for operation in the nanosecond range a new and improved method for rapidly charging the PFL or equivalently applying voltage to the switch is required. The invention is such a method.

FIG. 3 is an illustration of the present invention which includes the following elements:

(1) Source transmission line, Z0
(2) Pulse Froming Line, PFL, Z1
(3) Switch, S01
(4) Output Switch, Sp1
(5) Output transmission line transformer, which matches Z1 to ZL
(6) Load, ZL
(7) High pressure container, outer coaxial conductor
(8) Input terminal and seal
(9) Output terminal and seal
(10) Charging means, also see alternate means (10a), (10b)

Spark gap switch technology, as used in FIG. 3, is elaborated upon in U.S. Pat. No. 4,963,799 issued to O'Loughlin, the disclosure of which is incorporated herein by reference.

A source transmission line (1) with impedance Z0 and transit time T0 is connected through a switch to a pulse forming transmission line (PFL) (2) with impedance Z1 and transit time T1. The source line is initially charge to VO volts and the PFL is uncharged and the switch S01 (3) open. The impedance of Z0 is larger than Z1 and the time T0 is larger than T1. When the switch S01 (3) is closed energy flows from the source line to the PFL. As the energy and voltage build up on the PFL (2) the output switch Sp1 (4) closes and delivers the energy of the PFL to the output transmission line section (5). The impedance of the output. transmission line section is matched to the PFL impedance so that all of the energy in the PFL flows into the output section in the form of a pulse with time duration equal to 2*T1. The output section (5) is configured as a tapered transmission line. The input impedance is equal to the PFL impedance Z1 and the output impedance is equal to the load impedance ZL. The reason for the tapered impedance is to match the PFL impedance to the load impedance to achieve a maximum efficiency transfer of energy from the PFL to the load Z1 (6). The implementation of the invention in general requires that the PFL impedance be a particular value which is not necessarily matched to the required load impedance ZL (6). The tapered output section (5) provides an impedance matching or transforming function to achieve the PFL to ZL match. The entire apparatus is enclosed in a sealed container (7)

which provides the enclosure for the high pressure gas and the outer conductor for the coaxial transmission lines. The ends of the container (7) are fitted with feed-thru coaxial terminals (8), (9) which provide a seal for the high pressure gas. The high pressure gas fill is required for the operation of the switches and the electrical insulation between the inner and outer conductors of the coaxial lines. In order to charge the source line (1) a charging means (10) is connected to the line (1) through the terminal (8). The charging means may be any of several types commonly used for the purpose of charging a transmission line. Suitable charging means could be a high voltage DC power supply with a charging resistor or a charging inductor connected between. the power supply and terminal (8). Another type of charging means could be a double resonant transformer with the secondary winding connected to terminal (8), which is described in another application by entitled "Compact Pulse -General" the present inventor, Ser. No. 08/054,934 filed 27 Apr. 1993, the disclosure of which is incorporated herein by reference. The functioning of the invention is explained as follows. The source line time T0 is taken as a multiple of the PFL time T1 as T0=Nt * T1. We now measure the elapse of time in increments, Nt, of T1 from the closure of S01. In terms of Nt the elapsed time is, t=2*T1*Nt. The ratio of the impedances is Nz=Zo/Z1.

The voltage transmission coefficient from line 0 to line 1 is:

$$VT01 = 2\frac{Z1}{(Z0 + Z1)} = \frac{2}{(1 + Nz)} \quad (3)$$

The voltage reflection coefficient from line 0 to line 1 is:

$$VR01 = \frac{(Z0 - Z1)}{(Z0 - Z1)} = \frac{(Nz - 1)}{(1 + Nz)} \quad (4)$$

The ends of the lines not connected to the switch are considered to be open circuit and thus have voltage reflection coefficients of plus unity.

In terms of Nt the amplitudes of the forward and reverse voltage waves transmitted from line 0 to line 1 is:

$$V1\left(Nt = \left(\frac{V0}{2}\right)\left(\frac{(VT01\ (1 - VR01)^{Nt}}{(1 - VR01)}\right)\right) \quad (5)$$

In terms of Nt and Nz the fraction of the initial energy stored in line 0 which is transmitted to the PFL (line 1) is:

$$Eng01 = \left(\frac{Nz}{Nt}\right)\left(1 - \frac{(Nz - 1)}{(Nz + 1)}\right)^{Nt\ 2} \quad (6)$$

Figure 4:
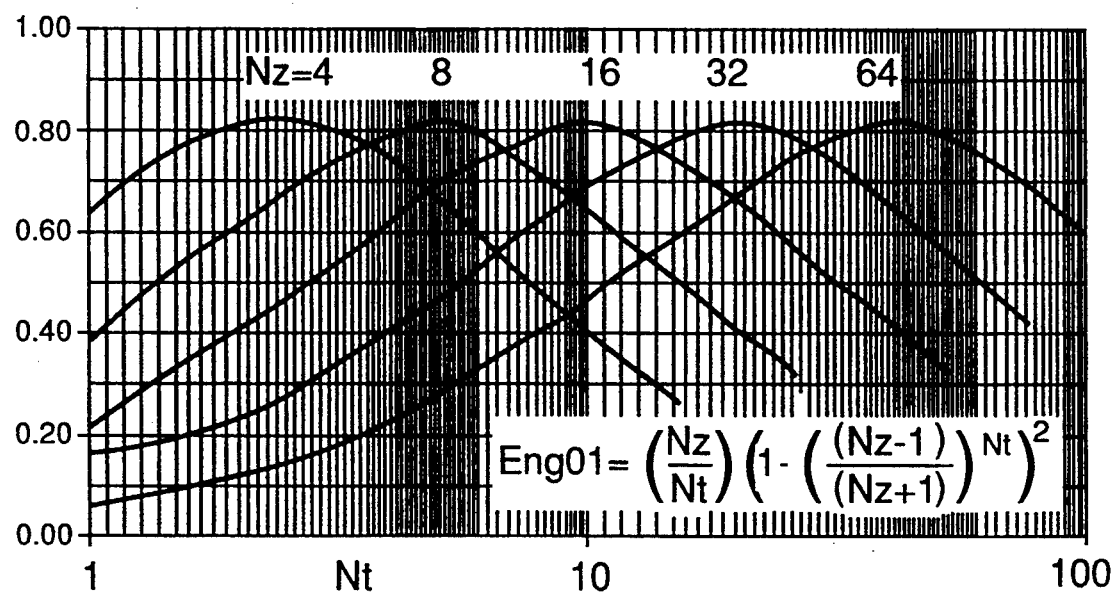
FIG. 4 is a chart of the energy transfer efficiency vs. Nt for Nz=4, 8, 16, 32, 64.
Figure 5:
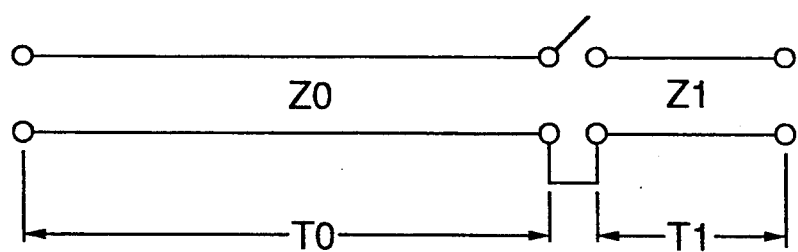
FIG. 5 is an illustration of two PFL switch configurations to illustrate Nz=Z0/Z1 and Nt=T0/T1.

Equation (6) is plotted in FIG. 4. This plot shows that given a particular Nz there is an optimum Nt which provides the maximum energy transfer from line 0 to the PFL (line 1). The maximum energy transfer efficiency is 81.5% for any Nz and the optimum Nt. $N_z=Z0/Z1$, and Nt=T0/T1, as shown in FIG. 5. Since the delay time or length and the impedance of the PFL are less than the source line T0 and Z0, there is a power increase and a time compression when energy is transferred from line 0 to the PFL. The maximum power increase does not occur for the same Nt at which maximum energy transfer takes place. The power increase is defined as the power ratio of the PFL power (if it were discharged in to a matched load) to the source line 0 power (if it were discharged in to a matched load). The power increase ratio is given by:

$$P10 = Nz\ 1 - \left(\frac{(Nz - 1)}{(Nz + 1)}\right)^{Nt\ 2} \quad (7)$$

Equation (7) normalized by Nz is plotted in FIG. 6. Since Nz>1 then from equation (7) and from FIG. 6 we see that the maximum power ratio approaches Nz when Nt becomes large. From FIG. 4 we can see that the maximum energy transfer occurs when Nt is approximately equal to Nz/2 and corresponds to a power gain of about Nz/2 as shown in FIG. 6.

In summary we have two criteria as the basis of a design selection. If we wish to have maximum energy efficiency we select Nt=approximately Nz/2 and by so doing have a power gain of approximately Nz/2 and a time compression of Nt. If we wish to sacrifice power gain for energy transfer efficiency we can operate with a higher Nt and obtain a power gain higher than Nz/2 but less than Nz. The actual numbers can be determined from FIG. 4 and FIG. 6 or from equations (6) and (7).

The use of the invention is best realized for generating pulses of less than a few nanoseconds with the PFL section and when using a source line which is in the Blumelein configuration. Such a design configuration is shown in FIG. 8. The source line impedance is higher than the PFL impedance, i.e. making Nz high. This will provide the impedance isolation required between the source line and the PFL and will also provide for a higher power gain and time compression. The Blumelein configuration provides for the direct connection between the source and PFL instead of through a switch. The switch in the Blumelein configuration is located at the end of the source line away from the connection to the PFL. See FIG. 9 for the schematic diagrams of the equivalent single source line and Blumelein configurations. The Blumelein, well known in the art, consists of two transmission lines which are charged in parallel and discharged in series. This is accomplished by connecting the lines in series but charging the lines with opposite polarity. When the switch, S0 in FIG. 8, is closed the polarity of that line reverses so the line voltages now are in series with adding polarities and provide energy to the PFL. Notice that for the two configurations to be equivalent the voltage to which the single line configuration is charged must be twice the voltage to which each of the Blumelein sections are charged. This is obvious from the fact that the Blumelein sections are stacked in series so each provides an equal contribution to the output. The same rational applies to the Blumlein section impedances, since they are in series then each section is one half the impedance of the single line equivalent. Actually the single line and Blumelein configurations are analytically identical however, in terms of practical realizations the Blumelein is advantageous. The Blumelein configuration advantages include the fact that the maximum charging voltage is one half that of the equivalent single line configuration and the Blumelein connects directly to the PFL section as opposed to the single line configuration where the connection is made through a switch.

In order to charge the Blumelein a charging source is required and any commonly used means of charging may be used.

To illustrate the use of the invention the following specific design example is provided. The objective is to design a pulse forming machine which meets the requirements in Table I.

TABLE I

| Output Pulse Width | 100 ps |
| --- | --- |
| Output Impedance | 50 ohms |
| Charging Time | 5 ns maximum |
| Output Power Level | 50 GW |
| Output Voltage | 500 kV |
| Design for optimum energy transfer, | 81% |

Figure 10:
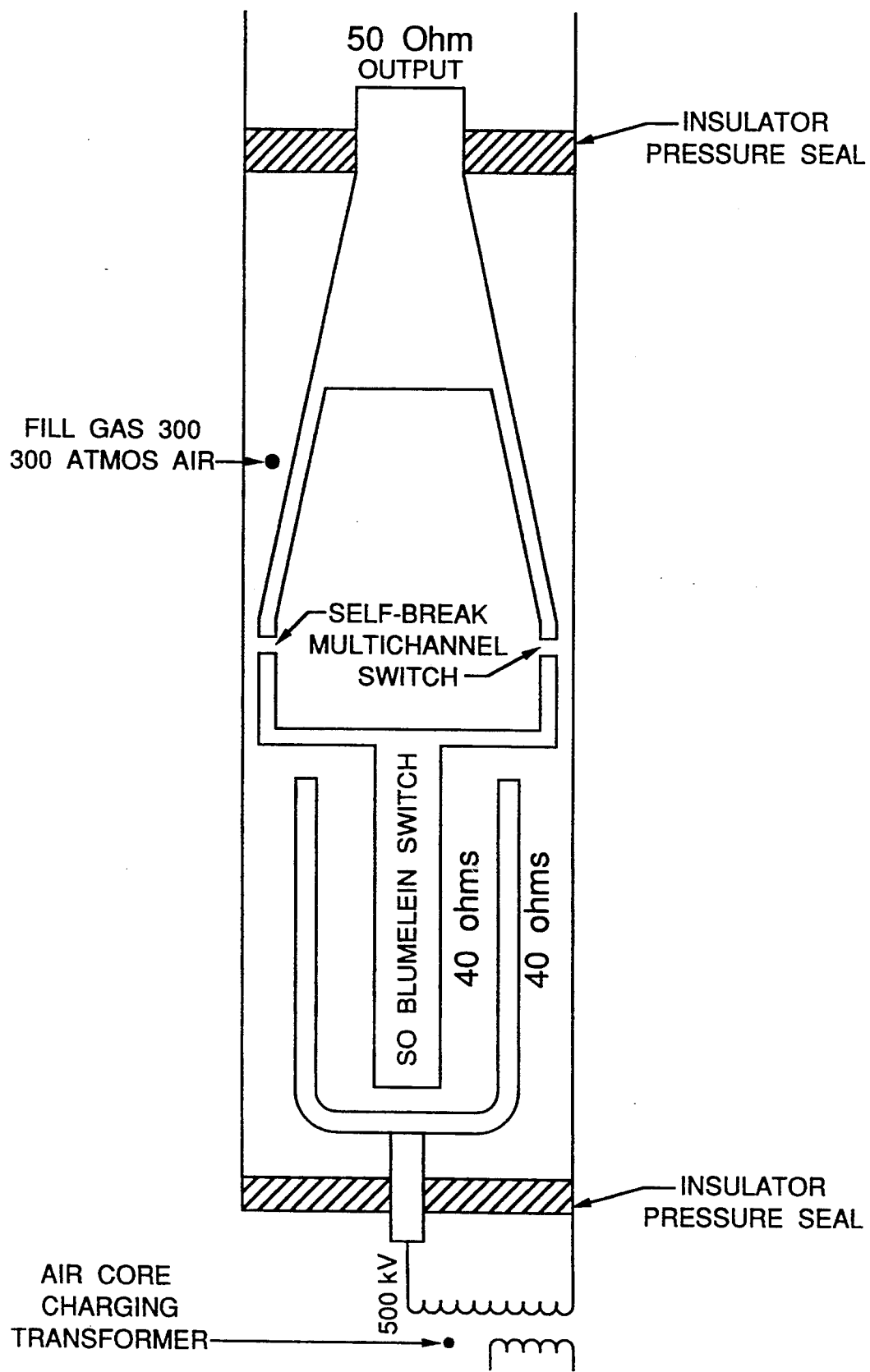
FIG. 10 is a specific design example of the invention (see Table 6).

From TABLE I the maximum time compression ratio, Nt, is 50 (5 ns/100 ps) which from FIG. 6 indicates that an impedance ratio, Nz, of about 80 would give an optimum energy efficiency. The impedance ratio of 80 implies that the source line impedance would have to be 4000 ohms if the PFL impedance were 50 ohms. A transmission line with an impedance of 4000 ohms is not practical. A conveniently high value of line impedance for the source line is about 80 ohms. We now wish to select a PFL impedance as low as practical, we choose a value of 5 ohms. Thus Nz becomes 16 (80/5). The required output impedance is 50 ohms. The PFL impedance of 5 ohms will be transformed to 50 ohms using a tapered transmission line transformer as will be explained later. From FIG. 4 with an Nz of 16 we find that the optimum energy transfer requires an Nt of 10. Thus the two way length of the source line is 1.0 ns (10×100 ps). Since the 1.0 ns is the charging time we are well within the requirement of TABLE I for a maximum of 5 ns charging time. We will use the Blumelein configuration of the source line in a coaxial configuration. The diagrams of the source line (line 0), the PFL line (line 1) and the impedance transformer section (line 2 are shown in FIG. 10. The operating voltage is 500 kV for the Blumelein. If we take 300 atmospheres of air as the operating pressure the breakdown stress is about 2 MV/cm. The maximum electric field stress, on the inner radius, of a coaxial line is given by:

$$R(r) = \frac{V}{r}\left(\ln\left(\frac{r0}{r}\right)\right) \quad (8)$$

where:

E(r) = Electric stress at radius r
r0 = outer radius of a coaxial line
r = inner radius of a coaxial line
V = Voltage impresses between r0 and r The impedance of a coaxial line is given by:

$$Z0 = 60\ln\left(\frac{r0}{r}\right) \quad (9)$$

where:

Z0 = Characteristic impedance

For the case at hand the total Blumelein impedance is 80 ohms so that the impedance for each section of the Blumelein is 40 ohms therefore by equation (9) ln(r0/r) = 0.6667. If we take the outer diameter of the outer Blumelein section as 15 cm then we can determine the inner diameter as 7.70 cm using equation (9). We take the wall thickness of this section as 1.00 cm. Therefore the outer diameter of the inner Blumelein section is 5.70 cm. Again using equation (9) the inner diameter of the inner Blumelein section is determined as 2.92 cm. Maximum electric field stress occurs on this inner most section and is given by equation (8) as 513 kV/cm. The breakdown strength of the gas has been determined as 2 MV/cm thus a breakdown margin of about four is provided. The length of the Blumelein is found by the delay length (0.5 ns) times the speed of light (3E10) or 15 cm. The length of the PFL line is 15 cm/Nt = 1.5 cm. The rim of the PFL and the rim of the output section of 5 ohm coaxial line becomes the multichannel high pressure switch. The output impedance is 5 ohms at the switch but this is transformed with a tapered transmission line section to the required output impedance of 50 ohms as indicated in FIG. 6. The coaxial insulators at the input and output ends of the coaxial structure must provide both the electrical insulation and the pressure seal for the high pressure gas.

The operation of the device begins with the charging of the Blumelein section to a voltage of 500 kV. The means shown in FIG. 10 is a dual resonant air core transformer however, resistive or inductive resonant charging may be used with no effect on the operation. The Blumelein switch, S0, is adjusted to self break or it may be triggered. In either case the switch S0 closes when the rated charging voltage of 500 kV is achieved. The switched section of the Blumelein reverses its polarity due to the closure of the switch S0 and delivers it energy, (81.5%) to the PFL over a time duration of about 1.0 ns. The output switch of the PFL is thus over volted in the 1.0 ns time and self breaks in the multichannel mode. Then the PFL discharges into the 5 ohm output section forming an output pulse with a length of 100 ps and power of 50 GW. The impedance out of the PFL is 5 ohms as required from TABLE I. However, the ultimate load impedance is required to be 50 ohms. It is a simple matter to transform from the 5 ohms to 50 ohms by means of a tapered transmission line well known in the art as shown in FIG. 10. The tapered transmission line transformer is designed with an input impedance of 5 ohms and output impedance of 50 ohms. The radial dimensions of the line are determined by equation (9). The length of the PFL must be several times the pulse length in order to avoid severe waveform distortion, therefore the length is taken a 6 time the length of the PFL or 9 cm.

As described above, it is the purpose of the invention to provide a means for charging PFLs ((Pulse Forming Lines) on a time scale of a few nanoseconds. The need for the invention is basic to the method of generating subnanosecond pulses using very high pressure gas switches. This method requires a very fast low inductance switch such as is possible with gas pressures of up to 350 atmospheres or more. The proper operation of this type of switch requires that the voltage be applied to the switch in only a few nanoseconds. The invention is an efficient and advantageous means of accomplishing this.

The use of the invention includes all high pressure gas switching applications in the nanosecond and sub nanosecond pulse range. This includes applications where very high power, up to several terrawatts; and very narrow pulses, nanosecond to several picoseconds, are required. Specific applications are impulse (ultra wideband) radar. The invention would be supplied by a HVDC power supply that ranges from 1 kilovolt up to 100's of kilovolts, depending upon the application involved.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A system for charging a pulse forming transmission line with an electrical pulse, said pulse forming transmission line having a predetermined impedance, said system comprising:
    a source transmission line which is charged with an electrical pulse which ranges up to include several hundred kilovolts, and which has a lower electrical impedance than the pulse forming transmission line;
    a first high pressure gas switch, which connects the pulse forming transmission line to the pulse forming transmission line, and which switches in times that can typically range between about 10.0 nanoseconds and 100 picoseconds and closes to allow the electrical charge to flow to and charge the pulse forming transmission line in times that can range down to about the order of nanoseconds;
    an output transmission line which has an electrical impedance that matches the predetermined impedance of the pulse forming transmission line said output transmission line being electrically connected with said pulse forming transmission line to deliver said electrical pulse thereto;
    a second high pressure gas switch which electrically connects the pulse forming transmission line to the output transmission line and which closes automatically when the pulse forming transmission line is charged with said electrical charge, said second high pressure gas switch thereby causing the pulse forming transmission line to output said electrical pulse; and
    a means for charging the source transmission line.

2. A system, as defined in claim 1, wherein said charging means comprises:
    a high voltage DC power supply which supplies power at typical levels ranging between 1K volt and 100's of kilovolts;
    a storage capacitor which is electrically connected in parallel between said high voltage DC power supply;
    a switch; and
    a transformer which is electrically connected by said switch to said storage capacitor and to said source transmission line to conduct said electrical pulse therebetween.

3. A system, as defined in claim 1, wherein said charging means comprises:
    a high voltage DC power supply which supplies power at levels ranging between 1K volt and 100 of kilovolts; and
    an inductor coil which is electrically connected to said high voltage DC power supply and to said source transmission line to conduct said electrical pulse therebetween.

4. A system, as defined in claim 1, wherein said charging means comprises:
    a high voltage DC power supply which supplies power at levels ranging between 1K volt and 100 kilovolts; and
    a resistor which is electrically connected to said high voltage DC power supply and to said source transmission line to conduct said electrical pulse therebetween.

5. A system as defined in claim 1, wherein said second high pressure gas switch comprises a multichannel spark gap switch which is filled to about 300 atmospheres with pressurized gas.

6. A system as defined in claim 2, wherein said second high pressure gas switch comprises a multichannel spark gap switch which is filled to about 300 atmospheres with pressurized gas.

7. A system as defined in claim 3, wherein said second high pressure gas switch comprises a multichannel spark gap switch which is filled to about 300 atmospheres with pressurized gas.

8. A system as defined in claim 4, wherein said second high pressure gas switch comprises a multichannel spark gap switch which is filled to about 300 atmospheres with pressurized gas.

9. A system as defined in claim 1, where said first high pressure gas switch comprises a spark gap switch which is filled to about 300 atmospheres with pressurized gas.

10. A system as defined in claim 2, wherein said first high pressure gas switch comprises a spark gap switch which is filled to about 300 atmospheres with pressurized gas.

11. A system as defined in claim 3, wherein said first high pressure gas switch comprises a spark gap switch which is filled to about 300 atmospheres with pressurized gas.

12. A system as defined in claim 4, wherein said first high pressure gas switch comprises a spark gap switch which is filled to about 300 atmospheres with pressurized gas.

13. A system as defined in claim 5 wherein said first high pressure gas switch comprises a multichannel spark gap switch which is filled to about 300 atmospheres with pressurized gas.

14. A system as defined in claim 6, wherein said first high pressure gas switch comprises a spark gap switch which is filled to about 300 atmospheres with pressurized gas.

15. A system as defined in claim 7, wherein said first high pressure gas switch comprises a spark gap switch which is filled to about 300 atmospheres with pressurized gas.

16. A system as defined in claim 8, wherein said first high pressure gas switch comprises a spark gap switch which is filled to about 300 atmospheres with pressurized gas.

17. A system, as defined in claim 13, wherein said first and second high pressure gas switches have a switching speed that ranges between 10–1000 picoseconds and which conduct said electrical pulse with voltage levels that range between 100–1,000 kilovolts.

18. A system, as defined in claim 14, wherein said first and second high pressure gas switches have a switching speed that ranges between 10–100 picoseconds and which conduct said electrical pulse with voltage levels that range between 100–1,000 kilovolts.

19. A system, as defined in claim 15, wherein said first and second high pressure gas switches have a switching speed that ranges between 10–1000 picoseconds and which conduct said electrical pulse with voltage levels that range between 100–1,000 kilovolts.

20. A system, as defined in claim 16, wherein said first and second high pressure gas switches have a switching speed that ranges between 10–1,000 picoseconds and which conduct said electrical pulse with voltage levels that range between 100–1,000 kilovolts.

* * * * *